United States Patent
Sohn

(10) Patent No.: US 7,745,862 B2
(45) Date of Patent: Jun. 29, 2010

(54) CMOS IMAGE SENSOR AND METHOD FOR MANUFACTURING THE SAME

(75) Inventor: Hyun Joon Sohn, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 47 days.

(21) Appl. No.: 12/232,682

(22) Filed: Sep. 22, 2008

(65) Prior Publication Data

US 2009/0072283 A1 Mar. 19, 2009

Related U.S. Application Data

(62) Division of application No. 11/319,487, filed on Dec. 29, 2005, now Pat. No. 7,442,572.

(30) Foreign Application Priority Data

Dec. 30, 2004 (KR) ............... 10-2004-0116557

(51) Int. Cl.
*H01L 31/062* (2006.01)
(52) U.S. Cl. ............... 257/292; 257/E27.133
(58) Field of Classification Search ............ 257/292, 257/294, 444, E27.133
See application file for complete search history.

(56) References Cited

U.S. PATENT DOCUMENTS

| 6,242,730 | B1 | 6/2001 | Lin et al. |
| 6,495,814 | B1 | 12/2002 | Suzuki et al. |
| 6,730,914 | B2 | 5/2004 | Chao et al. |
| 6,809,358 | B2 | 10/2004 | Hsieh et al. |
| 7,442,572 | B2 * | 10/2008 | Sohn ............... 438/59 |
| 2001/0023086 | A1 | 9/2001 | Park et al. |
| 2003/0143786 | A1 | 7/2003 | Thomas et al. |
| 2003/0213915 | A1 | 11/2003 | Chao et al. |

FOREIGN PATENT DOCUMENTS

| EP | 1026747 A2 | 8/2000 |
| EP | 1113499 A2 | 7/2001 |
| EP | 1026747 A3 | 8/2001 |
| EP | 1237197 A2 | 9/2002 |
| EP | 1113499 A3 | 4/2003 |
| EP | 1237197 A3 | 6/2005 |
| WO | WO 02/093653 A2 | 11/2002 |
| WO | WO 02/093653 A3 | 11/2002 |
| WO | WO 2004/077101 A2 | 9/2004 |
| WO | WO 2004/077101 A3 | 9/2004 |

OTHER PUBLICATIONS

International Search Reports dated Apr. 20, 2006.

\* cited by examiner

*Primary Examiner*—Mark Prenty
(74) *Attorney, Agent, or Firm*—McKenna Long & Aldridge LLP

(57) ABSTRACT

A CMOS image sensor and a method for manufacturing the same improves photosensitivity and prevent loss of light by forming a photo-sensing unit under a color filter. The CMOS image sensor may include a plurality of transistors formed on a semiconductor substrate, a metal line formed over the plurality of transistors for electrically connecting the plurality of transistors, and a plurality of photodiodes electrically connected with the plurality of transistors and formed over the metal line.

7 Claims, 8 Drawing Sheets

CMOS IMAGE SENSOR AND METHOD FOR MANUFACTURING THE SAME

This application is a divisional of U.S. patent application Ser. No. 11/319,487, filed on Dec. 29, 2005, now U.S. Pat. No. 7,442,572, and claims priority Korean Patent Application No. 10-2004-0116557, filed on Dec. 30, 2004, both of which are hereby incorporated by reference in their entireties for all purposes, as if fully set forth herein.

BACKGROUND OF THE INVENTION

1. Field of the Invention

The present invention relates to a CMOS image sensor and a method for manufacturing the same. More particularly, the present invention relates to a CMOS image sensor and a method for manufacturing the same that improves photosensitivity and obtains high integration by forming a photo-sensing unit under a color filter.

2. Discussion of the Related Art

An image sensor is a semiconductor device for converting an optical image to an electric signal. The image sensor is classified into charge coupled devices (CCD) and complementary metal oxide silicon (CMOS) image sensors.

In a CCD, metal-oxide-silicon (MOS) capacitors are adjacently arranged, and electric carriers are stored in and transferred from the MOS capacitors. In a CMOS image sensor, the number of MOS transistors corresponds to the number of pixels. This is enabled by CMOS technology of using a control circuit and a signal processing circuit as peripheral circuits, whereby output signals are sequentially outputted with the MOS transistors in a switching method.

The CMOS image sensor changes information of objects to electric signals. The CMOS image sensor includes signal processing chips which include photodiodes. Each of the signal processing chips is provided with an amplifier, an analog-digital converter, an internal voltage generator, a timing generator, and a digital logic. The CMOS image sensor has advantages in that it can realize the decrease in space, power and cost.

Also, the CCD is manufactured by a high-priced specialized process. However, the CMOS image sensor is manufactured in a mass production by an inexpensive silicon wafer etching process. In addition, the CMOS image sensor has high integration.

Generally, the CMOS image sensor includes a photo-sensing unit and a logic circuit unit, wherein the photo-sensing unit receives the light, and the logic circuit unit converts the light to electric signals. In order to improve photosensitivity, there is a requirement for increasing an occupying area of the photo-sensing unit in the entire CMOS image sensor. However, since an entire area of the CMOS image sensor is fixed, the aforementioned method for increasing the occupying area of the photo-sensing unit has limits. Accordingly, there is a requirement for condensing the light so that it may reach the photo-sensing unit by changing the path of light incident on the remaining areas except the photo-sensing unit. For this, a micro-lens is provided to correspond to the photo-sensing unit on a color filter array.

The color filter array may be formed of red, green and blue colors, or may be formed of yellow, magenta and cyan colors.

A CMOS image sensor according to the related art will be described with reference to the accompanying drawings.

FIGS. 1A to 1F are cross sectional views illustrating a method for manufacturing a CMOS image sensor according to the related art.

As shown in FIG. 1A, P-type ions, such as boron ions, are selectively implanted to a semiconductor substrate 100, thereby forming a P-type well 101. For device isolation, a predetermined portion of the semiconductor substrate 100 is selectively etched, and is then filled with an insulating layer, thereby forming a field oxide layer 102.

Then, a gate oxide layer (not shown) is formed on the semiconductor substrate 100. Also, a gate electrode 105 is formed on the gate oxide layer, wherein the gate electrode 105 is comprised of a polysilicon layer 103 and a tungsten silicide layer 104.

Subsequently, lightly-doped N-type and P-type diffusion regions 106 and 107 are formed in a photo-sensing area of the semiconductor substrate 100. As a result, a photodiode is formed in the photo-sensing area of the semiconductor substrate 100.

For obtaining an LDD (Lightly Doped Drain) structure in source and drain regions of a transistor, lightly-doped N-type LDD regions 108 are formed in the semiconductor substrate 100 to correspond to both sides of the gate electrode 105. Then, a TEOS oxide layer (not shown), or a nitride layer (not shown), is deposited by LPCVD. The TEOS oxide layer is then anisotropically etched, to form spacers at both sidewalls of the gate electrode 105. Also, a highly-doped N-type diffusion region 110 is formed in the surface of the semiconductor substrate 100.

Referring to FIG. 1B, the TEOS oxide layer, or nitride layer, is deposited at a thickness of about 1000 Å by LPCVD. Also, a BPSG layer (not shown) is formed on the TEOS oxide layer by HPCVD.

Then, a first metal dielectric layer 111 is formed by flowing the BPSG layer. Also, a contact hole 112 for exposing the highly-doped N-type diffusion region 110 is formed by selectively etching the first metal dielectric layer 111. After forming a first glue layer 113 of titanium Ti, a first aluminum layer 114 for line formation is formed on the first glue layer 113. Then, a first titanium nitride layer 115 of the non-reflective property is formed on the first aluminum layer 114. Then, the first glue layer 113, the first aluminum layer 114 and the first titanium nitride layer 115 are selectively etched to form a first metal line 116. The contact hole 112 is formed in a plasma etching process.

Referring to FIG. 1C, a TEOS oxide layer 117 is formed by PECVD (Plasma Enhanced Chemical Vapor Deposition). Also, an SOG (Spin On Glass) oxide layer 118 is coated on the TEOS oxide layer 117, and then a heat treatment and a planarization process are applied thereto.

Then, a first PECVD oxide layer 119 is formed on the first TEOS oxide layer 117 and the first SOG oxide layer 118. The first TEOS oxide layer 117, the first SOG oxide layer 118 and the first PECVD oxide layer 119 constitute a second metal dielectric layer.

As shown in FIG. 1D, a via-hole 121 is formed by selectively etching the second metal dielectric layer. Then, after forming a second glue layer 122 of titanium Ti, a second aluminum layer 123 is formed on the second glue layer 122. A second titanium nitride layer 124 having a non-reflective property is formed on the second aluminum layer 123. Then, the second glue layer 122, the second aluminum layer 123 and the second titanium nitride layer 124 are selectively etched by plasma, thereby forming a second metal line 125.

Subsequently, a second TEOS oxide layer 126 is formed on an entire surface of the semiconductor substrate including the second metal line 125. Then, a second SOG oxide layer 127 is formed on the second TEOS oxide layer 126, and a second PECVD oxide layer 128 is formed on the second SOG oxide layer 127.

The second TEOS oxide layer 126, the second SOG oxide layer 127 and the second PECVD oxide layer 128 constitute a third metal dielectric layer. By repeating the above-mentioned steps, it is possible to form metal lines.

As shown in FIG. 1E, an oxide layer is formed at a thickness of about 8000 Å on the third metal dielectric layer by PECVD. The oxide layer functions as a passivation layer 129. Then, the passivation layer 129 and the third metal dielectric layer, which correspond to a peripheral circuit area, are selectively etched to form a pad opening area 130 for an electrode terminal.

As shown in FIG. 1F, a color filter array 131 and a planarization layer 132 are sequentially formed on the passivation layer 129. Then, a micro-lens 133 is formed on the planarization layer 132.

FIG. 2 is a layout of a photo-sensing unit and a gate operating unit in the CMOS image sensor according to the related art. As shown in FIG. 2, the photo-sensing unit 134 is separately formed from the gate operating unit 135.

However, the related art CMOS image sensor and the method for manufacturing the same have the following disadvantages.

First, because the photo-sensing unit is separately formed from the color filter array, a loss of light occurs. Since a thick dielectric material is formed between the photo-sensing unit and the color filter array, the amount of incident light that reaches the photodiode is decreased due to absorption, refraction and reflection of light. Thus the photosensitivity of the CMOS image sensor is lowered. In addition, since the photo-sensing unit and the gate operating unit are separately formed from each other, it is difficult to realize high-integration of the CMOS image sensor.

SUMMARY OF THE INVENTION

Accordingly, the present invention is directed to a CMOS image sensor and a method for manufacturing the same that substantially obviates one or more problems due to limitations and disadvantages of the related art.

An advantage of the present invention is to provide a CMOS image sensor and a method for manufacturing the same that improves photosensitivity and prevents loss of light by forming a photo-sensing unit under a color filter.

Another advantage of the present invention is to provide a CMOS image sensor and a method for manufacturing the same that enables the realization of high-integration in a circuit.

Additional features and advantages of the invention will be set forth in the description which follows and in part will be apparent from the description or may be learned by practice of the invention. The objectives and other advantages of the invention may be realized and attained by the structure and method particularly pointed out in the written description and claims hereof as well as the appended drawings.

To achieve these and other advantages and in accordance with the purpose of the invention, as embodied and broadly described, a CMOS image sensor includes a plurality of transistors formed on a semiconductor substrate, a metal line formed over the plurality of transistors for electrically connecting the plurality of transistors, and a plurality of photodiodes electrically connected with the transistors and formed over the metal line.

In another aspect of the present invention, a method for manufacturing a CMOS image sensor includes forming a plurality of transistors on a semiconductor substrate, forming a metal line over the plurality of transistors for electrically connecting the plurality of transistors; and forming a plurality of photodiodes over the metal line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate exemplary embodiment(s) of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or similar parts.

A CMOS image sensor and a method for manufacturing the same according to the present invention will be described with reference to the accompanying drawings.

Figure 1A:
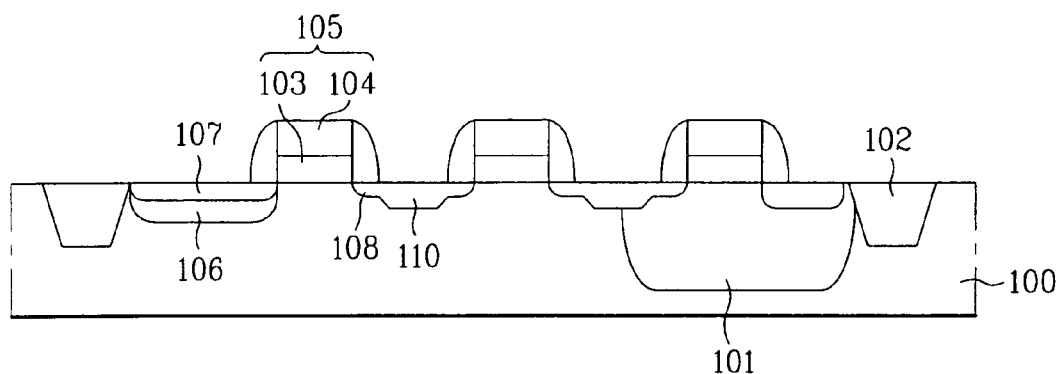
FIGS. 1A to 1F are cross sectional views illustrating a CMOS image sensor fabricated by a method for manufacturing a CMOS image sensor according to the related art.
Figure 1B:
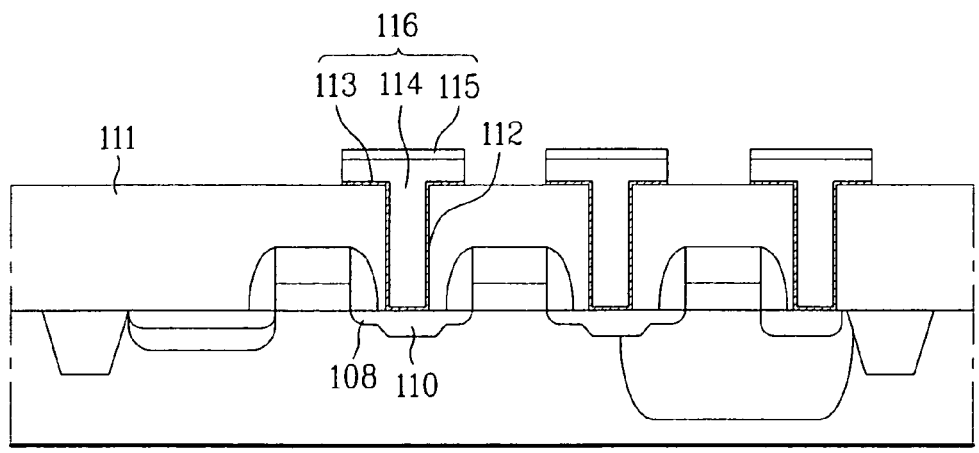
Figure 1C:
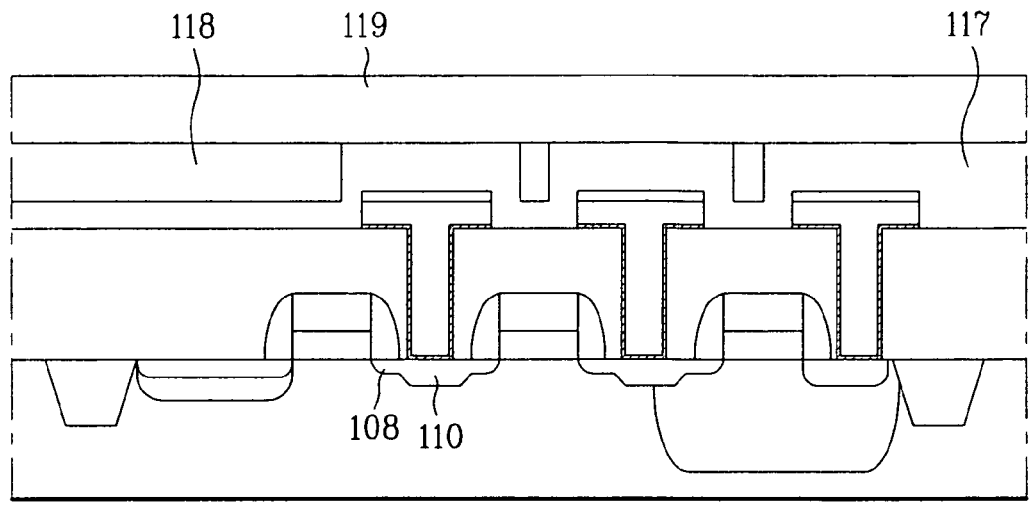
Figure 1D:
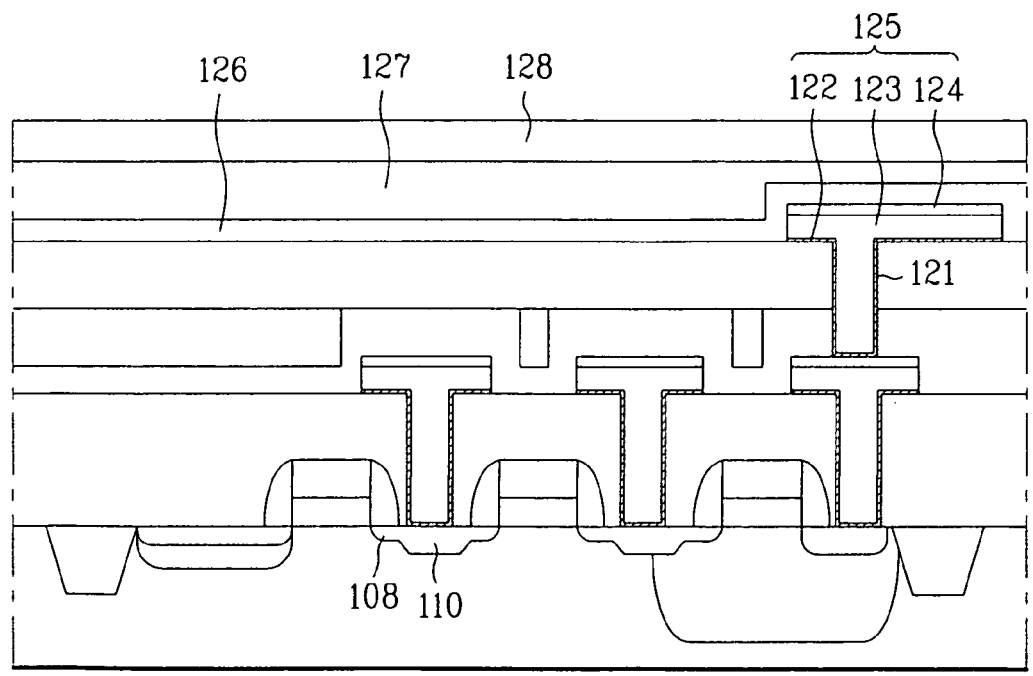
Figure 1E:
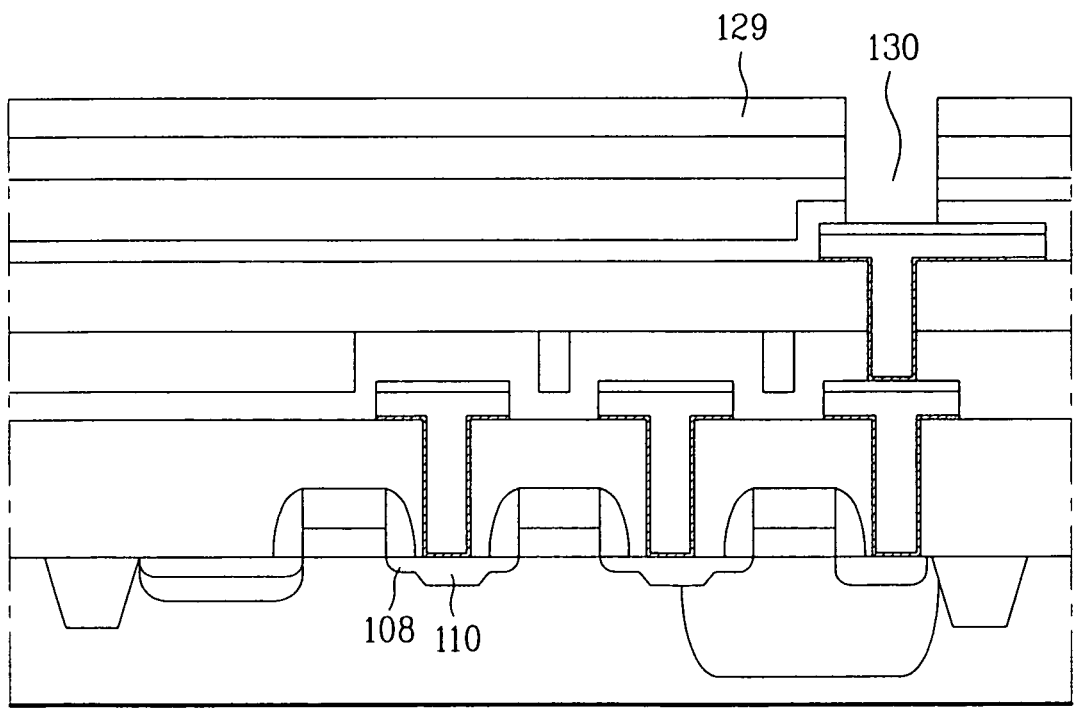
Figure 1F:
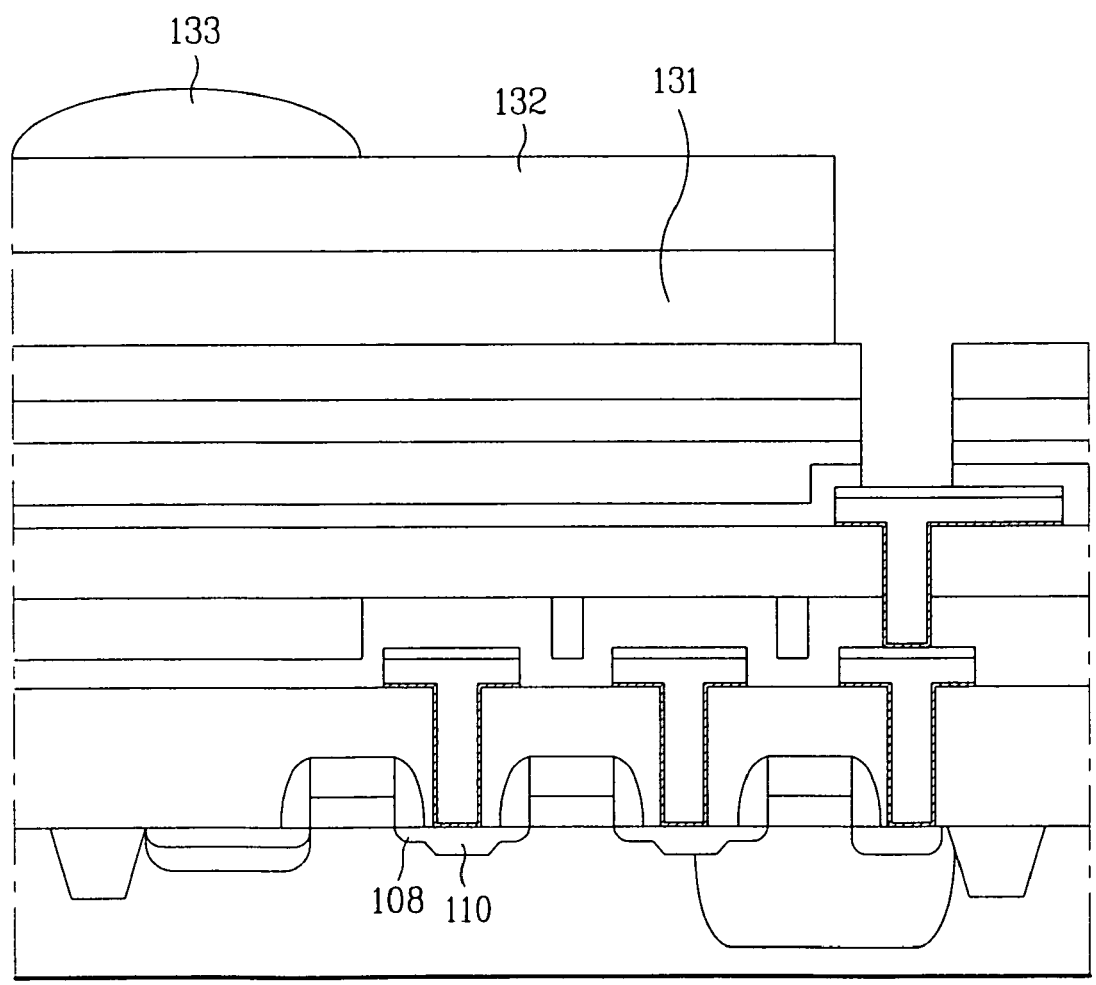
Figure 2:
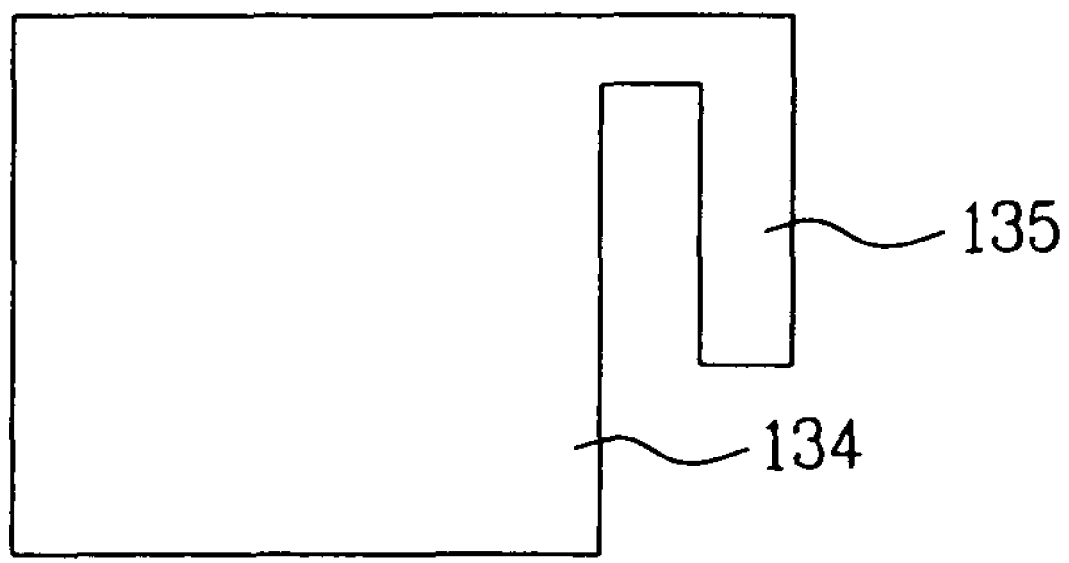
FIG. 2 is a layout of a photo-sensing unit and a gate operating unit in a CMOS image sensor according to the related art.
Figure 3A:
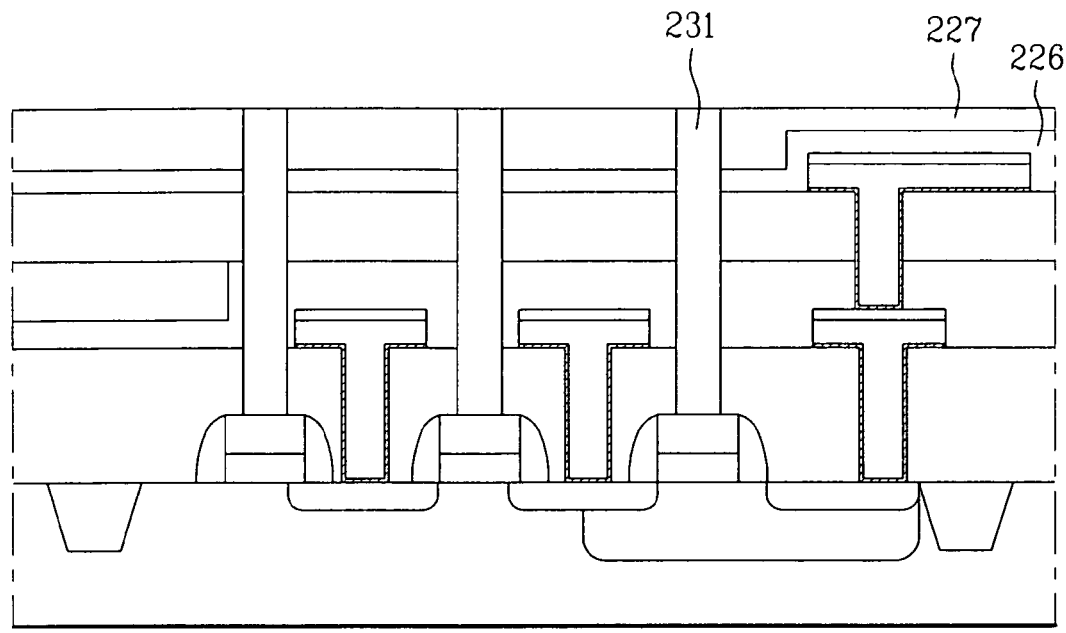
FIGS. 3A to 3D are cross sectional views illustrating a CMOS image sensor fabricated by a method for manufacturing a CMOS image sensor according to the present invention.

Referring to FIG. 3A, a method for manufacturing the CMOS image sensor according to the present invention may be the same as a method for manufacturing a CMOS image sensor according to the related art, except that a photo-sensing unit is not formed when forming a transistor in a semiconductor substrate of the CMOS image sensor. The photo-sensing unit according to the present invention is not formed until forming final metal lines on the semiconductor substrate.

That is, a trench for device isolation is formed by selectively etching the semiconductor substrate. Then, the trench is filled with an insulating layer, thereby forming a field oxide layer. Then, a gate oxide layer (not shown) is formed on the semiconductor substrate. Then, a polysilicon layer and a tungsten silicide layer are sequentially formed on the insulating layer, and are then selectively etched, thereby forming a gate electrode.

For forming an LDD (Lightly Doped Drain) structure in source and drain regions of the transistor, lightly-doped N-type LDD regions are formed in the semiconductor substrate corresponding to both sides of the gate electrode. Then, a TEOS oxide layer or a nitride layer is deposited by LPCVD, and is then anisotropically etched to form spacers at both sidewalls of the gate electrode. Also, a highly-doped N-type diffusion region is formed in the semiconductor substrate.

The TEOS oxide layer (not shown) is formed at a thickness of about 1000 Å by LPCVD, and a BPSG layer (not shown) is formed on the TEOS oxide layer by HPCVD. Then, a first metal dielectric layer is formed by flowing the BPSG layer. By selectively etching the first metal dielectric layer, a contact hole is formed to expose the highly-doped N-type diffusion region and the gate electrode. After forming a first glue layer of titanium Ti, a first aluminum layer for line formation is formed on the first glue layer. Then, a first titanium nitride layer having a non-reflective property is formed on the first aluminum layer. Then, the first glue layer, the first aluminum layer and the first titanium nitride layer are selectively etched to form a first metal line. Then, a contact hole is etched by plasma.

Subsequently, a first TEOS oxide layer and a first SOG (Spin On Glass) oxide layer are sequentially coated by PECVD (Plasma Enhanced Chemical Vapor Deposition), and then a heat treatment and a planarization process are applied thereto.

Then, a first PECVD oxide layer is formed on the first TEOS oxide layer and the first SOG oxide layer. The first TEOS oxide layer, the first SOG oxide layer and the first PECVD oxide layer constitute a second metal dielectric layer.

Then, a via-hole is formed by selectively etching the second metal dielectric layer. After forming a second glue layer of titanium Ti, a second aluminum layer is formed on the second glue layer, and a second titanium nitride layer having the non-reflective property is formed on the second aluminum layer. Then, the second glue layer, the second aluminum layer and the second titanium nitride layer are selectively etched by plasma, thereby forming a second metal line. By repeating the above-mentioned steps, it is possible to form necessary metal lines.

After forming a final metal line, a second TEOS oxide layer 226 and a second SOG oxide layer 227 are sequentially formed on the final metal line, thereby forming a third metal dielectric layer.

After coating a photoresist (not shown) on the second SOG oxide layer 227, an exposure and development process is applied to the coated photoresist. As a result, a photoresist pattern (not shown) has an open area corresponding to the gate electrode.

Then, an etching process is performed until the surface of the gate electrode is exposed. The etching process uses the photoresist pattern as a mask. Accordingly, through-holes are formed in the first, second and third metal dielectric layers. Then, the through-holes are filled with a conductive material for connection with the photo-sensing unit, thereby forming plugs 231.

Figure 3B:
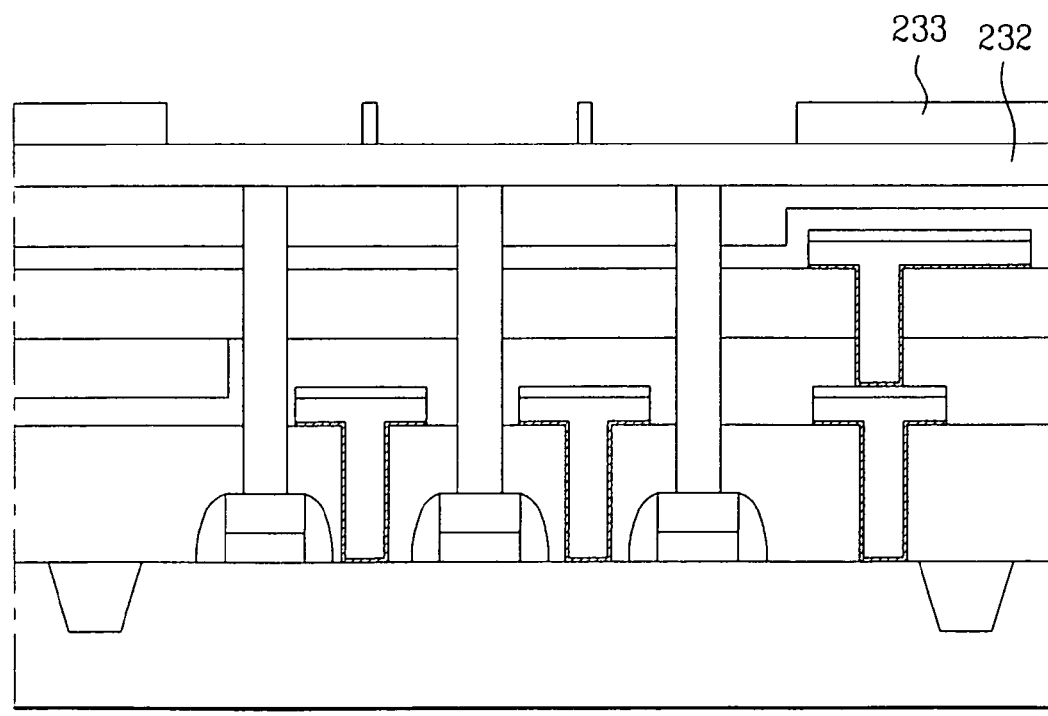

Referring to FIG. 3B, a silicon layer 232 is formed on the second SOG oxide layer including the plugs 231. Then, a photoresist pattern 233 is formed on the silicon layer 232, wherein the photoresist pattern 233 has an open area corresponding to each of the plugs 231.

Figure 3C:
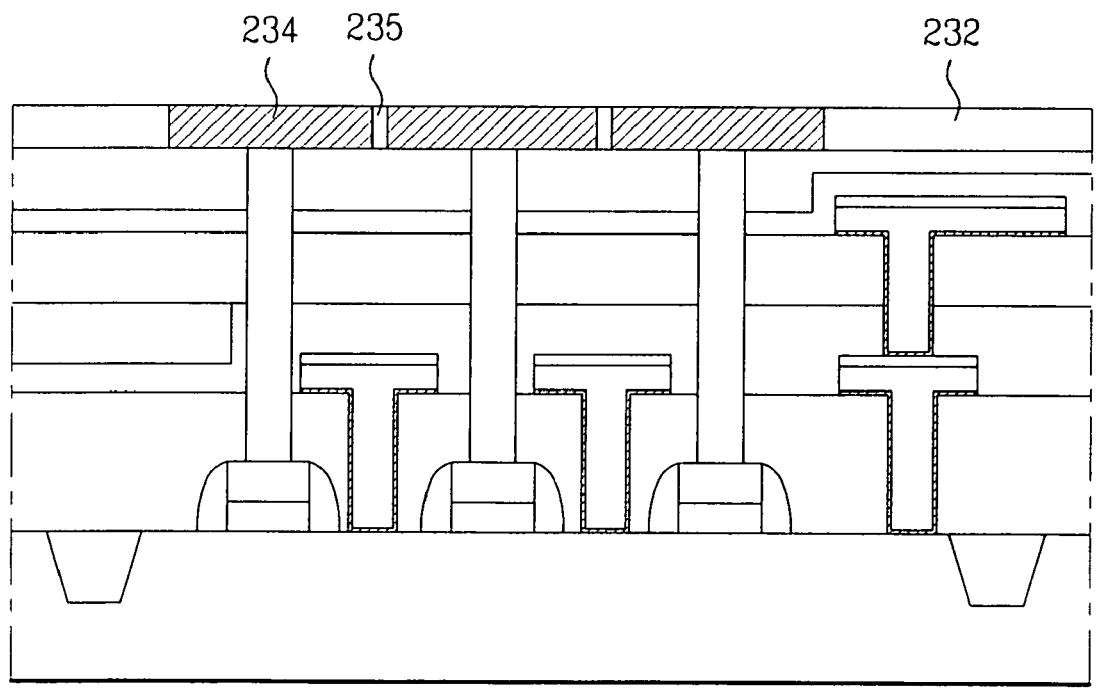

Subsequently, as shown in FIG. 3C, P-type and N-type impurity ions are implanted to the silicon layer 232 using the photoresist pattern 233 as a mask, thereby forming photodiodes 234. Also, isolation regions 235 for isolating the photodiodes are formed by lithography. Each of the isolation regions 235 is formed between the photodiodes 234 of the silicon layer 232.

Figure 3D:
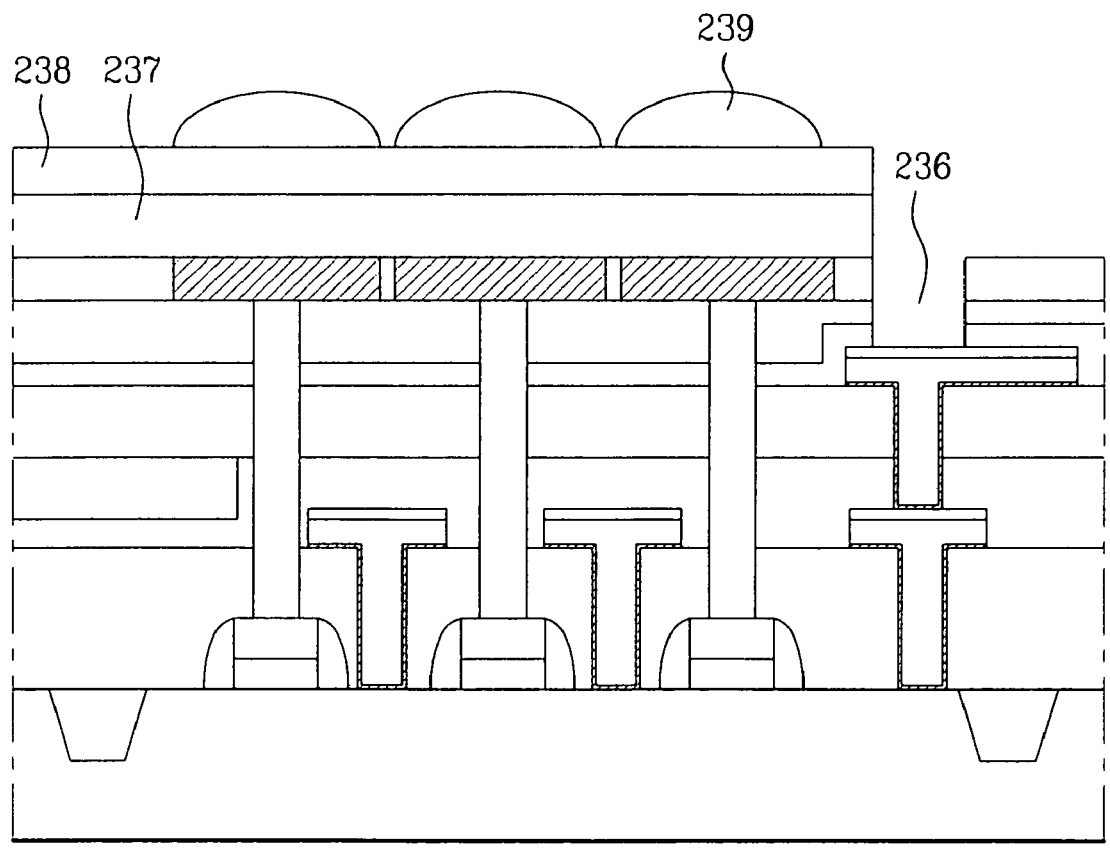

Referring to FIG. 3D, the silicon layer 232, the second TEOS oxide layer 226 and the second SOG oxide layer 227, which corresponds to a peripheral circuit area, are selectively etched to form a pad opening area 236 for an electrode terminal.

Then, red, green and blue color filter patterns 237 are formed on the respective photodiodes 234. A planarization layer 238 is formed on the color filter patterns 237. Then, micro-lenses 239 are formed on the planarization layer 238.

The CMOS image sensor and the method for manufacturing the same according to the present invention has the following advantages.

In the CMOS image sensor according to the present invention, the color filter patterns, which may be red, green and blue, are formed over the photodiodes. Thus, loss of light is prevented. Also, when forming the gate electrode, the photodiodes are formed over the gate electrode. Accordingly, it is possible to decrease the area of the photo-sensing unit, thereby realizing a highly integrated CMOS image sensor.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A CMOS image sensor comprising:
    a plurality of transistors formed on a semiconductor substrate;
    a metal line formed over the plurality of transistors for electrically connecting the plurality of transistors;
    a plurality of photodiodes electrically connected with the transistors and formed over the metal line;
    a color filter formed on the plurality of photodiodes;
    a planarization layer formed on the color filter; and
    a micro-lens formed on the planarization layer.

2. The CMOS image sensor of claim 1, further comprising a metal dielectric layer formed between the plurality of transistors and the plurality of photodiodes.

3. The CMOS image sensor of claim 2, wherein the metal dielectric layer comprises a TEOS oxide layer and an SOG oxide layer.

4. The CMOS image sensor of claim 2, wherein the metal dielectric layer comprises:
    a first metal dielectric layer formed between the plurality of transistors and the metal line; and
    a second metal dielectric layer formed between the metal line and the plurality of photodiodes.

5. The CMOS image sensor of claim 2, further comprising a plug formed in the metal dielectric layer for electrically connecting one of the plurality of transistors with one of the plurality of photodiodes.

6. The CMOS image sensor of claim 1, wherein the metal line is formed of two or more metal line layers.

7. The CMOS image sensor of claim 1, further comprising an isolation region formed between each of the plurality of photodiodes.

* * * * *